(12) United States Patent
Dannels

(10) Patent No.: US 10,534,060 B2
(45) Date of Patent: *Jan. 14, 2020

(54) PARALLEL MRI WITH SPATIALLY MISREGISTERED SIGNAL

(71) Applicant: TOSHIBA MEDICAL SYSTEMS CORPORATION, Tochigi (JP)

(72) Inventor: Wayne R. Dannels, Mentor, OH (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1756 days.

This patent is subject to a terminal disclaimer.

(21) Appl. No.: 13/914,160

(22) Filed: Jun. 10, 2013

(65) Prior Publication Data

US 2014/0361770 A1    Dec. 11, 2014

(51) Int. Cl.
| | |
|---|---|
| *G01R 33/565* | (2006.01) |
| *G01R 33/561* | (2006.01) |
| *G01R 33/34* | (2006.01) |
| *G01R 33/385* | (2006.01) |
| *G01R 33/54* | (2006.01) |

(52) U.S. Cl.
CPC ....... *G01R 33/56554* (2013.01); *G01R 33/34* (2013.01); *G01R 33/385* (2013.01); *G01R 33/543* (2013.01); *G01R 33/5611* (2013.01); *G01R 33/5616* (2013.01)

(58) Field of Classification Search
USPC .......... 324/300–322; 600/407–435; 382/128–131
See application file for complete search history.

(56) References Cited

U.S. PATENT DOCUMENTS

| | | | |
|---|---|---|---|
| 6,486,671 B1 | 11/2002 | King | |
| 6,559,642 B2 | 5/2003 | King | |
| 6,836,116 B2 | 12/2004 | King et al. | |
| 6,949,928 B2 | 9/2005 | Gonzalez Ballester et al. | |
| 8,918,159 B2 * | 12/2014 | Riederer | A61B 5/055 600/410 |
| 10,365,344 B2 * | 7/2019 | Dannels | G01R 33/34 |

(Continued)

FOREIGN PATENT DOCUMENTS

| | | |
|---|---|---|
| JP | 2002-315731 | 10/2002 |
| JP | 2004-275198 | 10/2004 |

(Continued)

OTHER PUBLICATIONS

Office Action dated Nov. 24, 2017 in U.S. Appl. No. 14/963,973.

(Continued)

*Primary Examiner* — Melissa J Koval
*Assistant Examiner* — Tiffany A Fetzner
(74) *Attorney, Agent, or Firm* — Nixon & Vanderhye P.C.

(57) ABSTRACT

A magnetic resonance imaging (MRI) system, method and/or computer readable medium is configured to effect improved parallel MR imaging with reduced unfolding artifacts by using either or both of:
(a) an unfolded "intermediate" diagnostic image to create a more accurate mask for use in further processing raw image data for final unfolded diagnostic images; and/or
(b) an extension of coil sensitivity maps by replication (rather than curve-fitted extrapolation) for use in final unfolding of diagnostic images.

20 Claims, 10 Drawing Sheets

(56) References Cited

U.S. PATENT DOCUMENTS

| | | | |
|---|---|---|---|
| 2003/0055330 A1 | 3/2003 | King et al. | 600/410 |
| 2004/0070394 A1 | 4/2004 | Gonzalez Ballester et al. | |
| 2004/0135579 A1 | 7/2004 | Takizawa et al. | |
| 2004/0189299 A1 | 9/2004 | Ikezaki | |
| 2006/0100503 A1 | 5/2006 | Takai et al. | |
| 2007/0052417 A1 | 3/2007 | Zhang | 324/309 |
| 2009/0115413 A1 | 5/2009 | Senegas et al. | 324/309 |
| 2009/0169084 A1 | 7/2009 | Li et al. | |
| 2009/0285463 A1* | 11/2009 | Otazo | G06T 3/4053 382/131 |
| 2011/0216955 A1 | 9/2011 | Takai | |
| 2012/0074940 A1 | 3/2012 | Kimura | |
| 2013/0082702 A1 | 4/2013 | Blumhagen et al. | |
| 2013/0187651 A1 | 7/2013 | Konta et al. | |
| 2013/0281831 A1* | 10/2013 | Riederer | A61B 5/055 600/420 |
| 2014/0361770 A1* | 12/2014 | Dannels | G01R 33/5611 324/309 |
| 2016/0097831 A1* | 4/2016 | Dannels | G01R 33/5611 324/318 |

FOREIGN PATENT DOCUMENTS

| | | |
|---|---|---|
| JP | 2009-142522 | 7/2009 |
| JP | 2009-160408 | 7/2009 |
| JP | 2011-200637 | 10/2011 |
| WO | 02/056767 A1 | 7/2002 |

OTHER PUBLICATIONS

Pruessmann, et al., "SENSE: Sensitivity Encoding for Fast MRI," *Magnetic Resonance in Medicine*, vol. 42, pp. 952-962 (1999).

Chen, et al., "Removal of EPI Nyquist Ghost Artifacts With Two-Dimensional Phase Correction," *Magnetic Resonance in Medicine*, vol. 51, pp. 1247-1253 (2004).

Xu, et al., "Robust 2D Phase Correction for Echo Planar Imaging Under a Tight Field-of-View," *Magnetic Resonance in Medicine*, vol. 64, pp. 1800-1813 (2010).

Office Action dated Jun. 30, 2016 in CN Application No. 2014800-01863.9.

Machine translation of JP 2009-142522.

Office Action dated Jun. 28, 2018 in U.S. Appl. No. 14/963,973.

Japanese office action dated Nov. 6, 2018, in Patent Application No. JP 2014-119987.

Office Action dated Nov. 9, 2018 in U.S. Appl. No. 14/963,973.

* cited by examiner

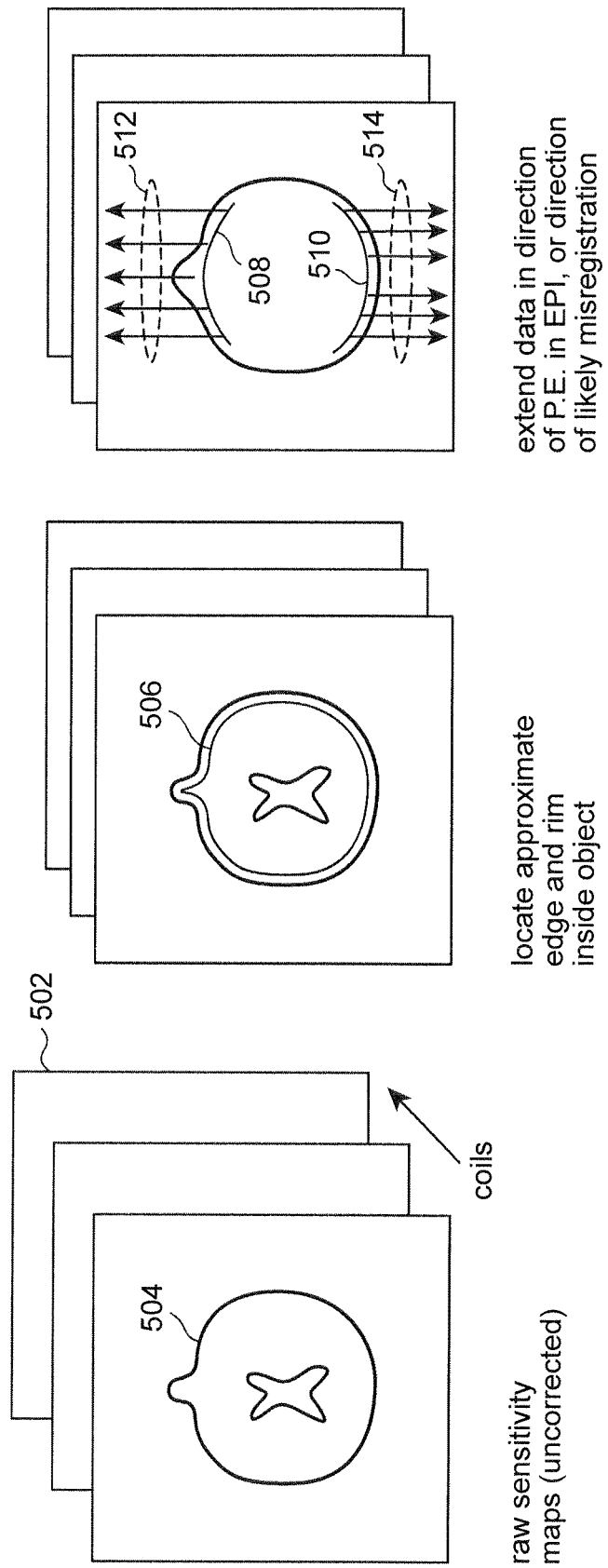

PARALLEL MRI WITH SPATIALLY MISREGISTERED SIGNAL

FIELD

The subject matter below relates generally to magnetic resonance imaging (MRI) systems and methods that use parallel imaging. In particular, the subject matter relates to reducing unfolding artifacts in diagnostic images generated from spatially misregistered signals.

BRIEF DESCRIPTION OF THE DRAWINGS

FIGS. 5A, 5B and 5C show sketch diagrams illustrating extending of sensitivity maps, in accordance with one or more embodiments.

DETAILED DESCRIPTION

Figure 1:
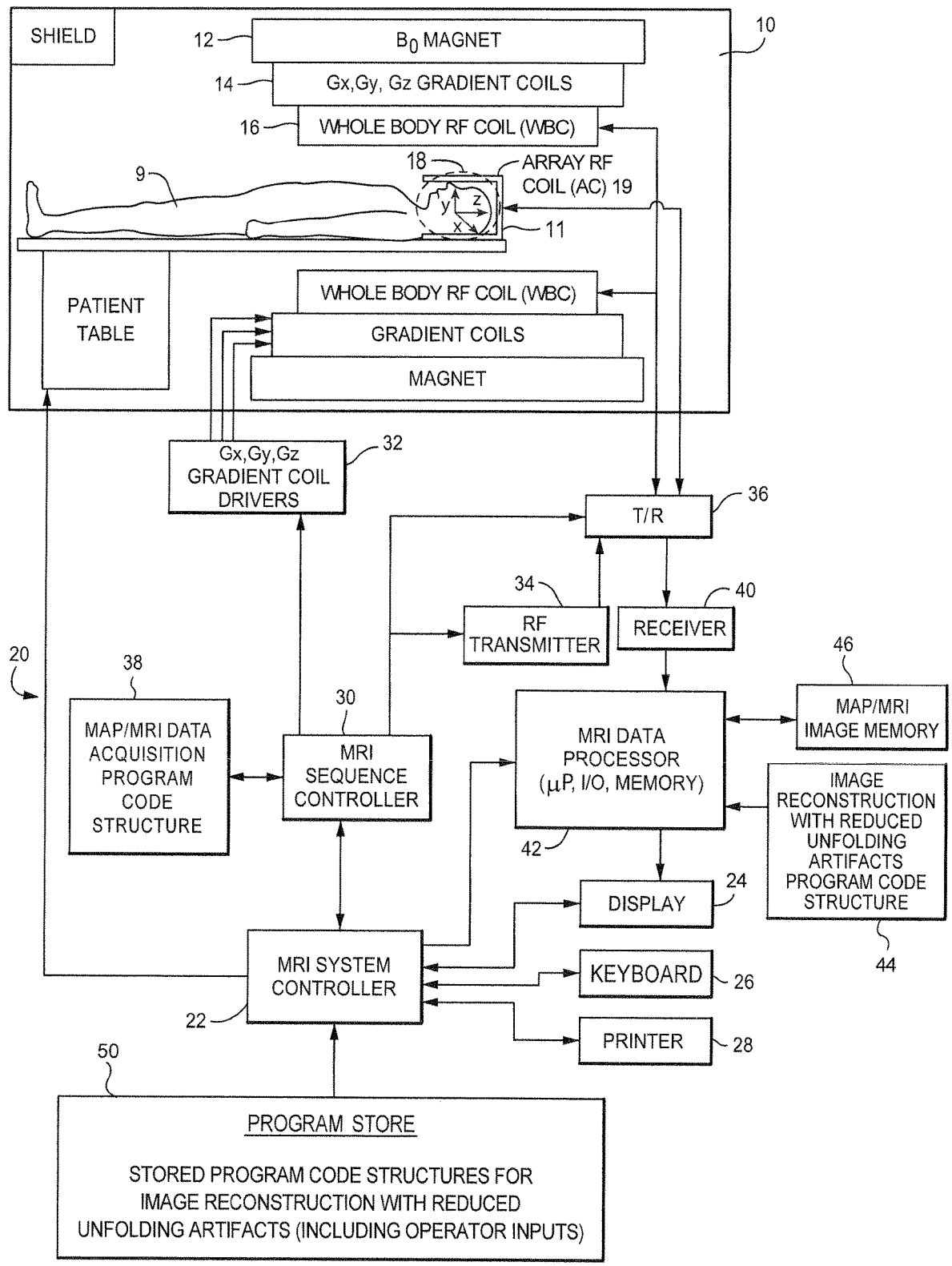
FIG. 1 is a high-level schematic block diagram of an MRI system adapted to reduce unfolding artifacts caused by spatially misregistered signals, in accordance with one or more embodiments.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field B0 magnet 12, a Gx, Gy and Gz gradient coil set 14 and a large whole body RF coil (WBC) assembly 16. Along the horizontal axis of this cylindrical array of elements is an imaging volume 18 shown as substantially encompassing the head of a patient 9 supported by a patient table 11. A smaller array RF coil (AC) 19 might be more closely coupled to the patient head (referred to herein, for example, as "scanned object" or "object") in imaging volume 18. As those in the art will appreciate, compared to the WBC (whole body coil), relatively small coils and/or arrays such as surface coils or the like are often customized for particular body parts (e.g., arms, shoulders, elbows, wrists, knees, legs, chest, spine, etc.). Such smaller RF coils are herein referred to as array coils (AC) or phased array coils (PAC). These may include at least one coil configured to transmit RF signals into the imaging volume and a plurality of receiver coils configured to receive RF signals from an object, such as the patient head in the example above, in the imaging volume.

An MRI system controller 22 has input/output ports connected to a display 24, keyboard 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing MRI imaging (also known as nuclear magnetic resonance, or NMR, imaging) techniques including parallel imaging. For parallel imaging, MRI sequence controller 30 may facilitate a preparation scan (prescan) sequence which is used to determine sensitivity maps for RF coils 16 and/or 19, and a scan sequence to obtain a diagnostic image The MRI system 20 includes an RF receiver 40 providing input to data processor 42 so as to create processed image data, which is sent to display 24. The MRI data processor 42 is also configured for access to previously generated coil sensitivity maps, extended coil sensitivity maps, masks data and/or system configuration parameters 46 and MRI image reconstruction program code structures 44 and 50.

Also illustrated in FIG. 1 is a generalized depiction of an MRI system program store 50 where stored program code structures (e.g., for image reconstruction with reduced unfolding artifacts, for defining graphical user interfaces and accepting operator inputs to same, etc.) are stored in non-transitory computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments described hereinbelow. The system components can be divided into different logical collections of "boxes" and typically comprise numerous digital signal processors (DSP), microprocessors and special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an image reconstruction process and/or sometimes a coil sensitivity map generation process, an array of computer-readable accessible data value storage sites in physical storage media will be transformed from some prior state (e.g., all uniform "zero" values or all "one" values) to a new state wherein the physical states at the physical sites of such an array vary between minimum and maximum values to represent real world physical events and conditions (e.g., the internal physical structures of a patient over an imaging volume space). As those in the art will appreciate, such arrays of stored data values represent and also constitute a physical structure—as does a particular structure of computer control program codes that, when sequentially loaded into instruction registers and executed by one or more CPUs of the MRI system 20, causes a particular sequence of operational states to occur and be transitioned through within the MRI system.

The exemplary embodiments described below provide improved ways to generate and display MR images.

MRI images are formed by acquiring RF response values (e.g. echo data) for points in k-space. The RF response values are generated by traversing k-space in two or three dimensions according to a configured pulse sequence. The acquisition of echo data in the frequency-encoding direction (e.g., along the x-axis) is typically rapid and on the order of several milliseconds. However, along the phase-encoding axis (e.g., y-axis), a different value of the applied phase-encoding gradient is used to sample each point. Therefore, typically, the acquisition time for an MRI image is largely determined by the number of phase-encoding steps.

Parallel imaging enables the shortening of acquisition time, by undersampling k-space along the phase-encoding direction. In many parallel imaging techniques, the number of sampled k-space points along the phase encoding direction is reduced, thereby significantly shortening the acquisition time. Instead of sampling each point along the phase-encoding direction, parallel imaging techniques enable the use of spatial information inherent in the RF coils (e.g., phased array coils) to reconstruct the MRI image using the samples of fewer selected points along the phase-encoding direction. The reconstructed images based upon parallel imaging may also yield improved spatial resolution. Pruessmann K. P., et al., "SENSE: Sensitivity Encoding for Fast MRI," Magn. Reson. Med., 42:952-962, 1999, ("Pruessmann") the contents of which is hereby incorporated by reference in its entirety, describes a parallel imaging and reconstruction technique. Another example parallel imaging and reconstruction technique is SPEEDER™ which is available in MRI systems from Toshiba Inc. However, parallel imaging may result in reconstruction artifacts in the output diagnostic images.

Reconstruction artifacts are primarily due to the unfolding process that is required to obtain the desired diagnostic images based upon the intermediate images which are acquired by undersampling (in effect reducing the field of view) in the phase-encoding direction. "Unfolding" is the process of combining multiple aliased images in order to generate a desired diagnostic image. Often, the multiple aliased images vary from each other, in that each was collected from different RF receive coils. When two or more aliased images are unfolded, various artifacts may occur. Such artifacts resulting from the unfolding process are referred to herein as "unfolding artifacts."

Unfolding artifacts, particularly when combining spatially misregistered signals, can pose significant challenges to the accurate interpretation of diagnostic images. Spatial misregistration can occur in any type of MRI, but may be particularly significant in some techniques such as echo planar imaging (EPI). EPI applications, especially at high fields, benefit from being able to take a complete 2D (2-dimensional) image in a single shot. Acquiring a complete image in a single shot is highly desired for applications such as, for example, diffusion (e.g., diffusion weighted imaging—DWI), functional MRI (FMRI), and perfusion (dynamic susceptibility contrast (DSC) enhancement or arterial spin labeling (ASL)). However, EPI suffers from major distortions associated with, for example, susceptibility, chemical shift, imperfect shimming, and eddy currents. Conventional acquisition encoding and reconstruction can cause the spatial misregistration of these distortions. Specifically, when k-space is traversed in a fast zig-zag pattern, the y-direction (e.g., the phase encoding direction) is traversed more slowly that the x-direction (e.g., the frequency encoding direction). In effect, this results in the second gradient (e.g., in the phase encoding direction) at times being much weaker relative to the first gradient, therefore resulting in more significant distortion along the phase encoding direction.

Many parallel imaging techniques, including those referred to above, use two distinct image acquisitions to reconstruct the final diagnostic image. In addition to the main scan, which yields what is referred to here as an "intermediate diagnostic image," a coil calibration prescan image also contributes to the final diagnostic image. The main scans are pixel aliased as a result of the reduced unaliased field of view. In some main scans, such as, for example, in EPI main scans, the MR signal may be misregistered (or displaced) before antialiasing compared to the corresponding coil calibration scan image (or corresponding coil sensitivity maps). If this discrepancy is not resolved, unfolding artifacts may be visible in the final diagnostic image. The most serious of these artifacts appear as areas of discrete aliases shifted in the phase encode direction. However, these artifacts can also appear as reduced signal at the particular locations or increased noise (decreased SNR), or a combination of some or all of these aspects.

Figure 2A:
FIG. 2A illustrates an example MRI diagnostic image showing spatial distortions, generated using echo planar imaging (EPI) in a conventional MRI system without parallel imaging.

FIG. 2A illustrates an EPI image acquired without parallel imaging and showing a severe misregistration. For example, in the MRI image, the right eye appears stretched in an anterior (upward) direction relative to the head. In FIG. 2A, the phase encoding is in the front-back direction of the head (e.g., y-direction), and is shown as top-down or vertical direction in the image.

Figure 2B:
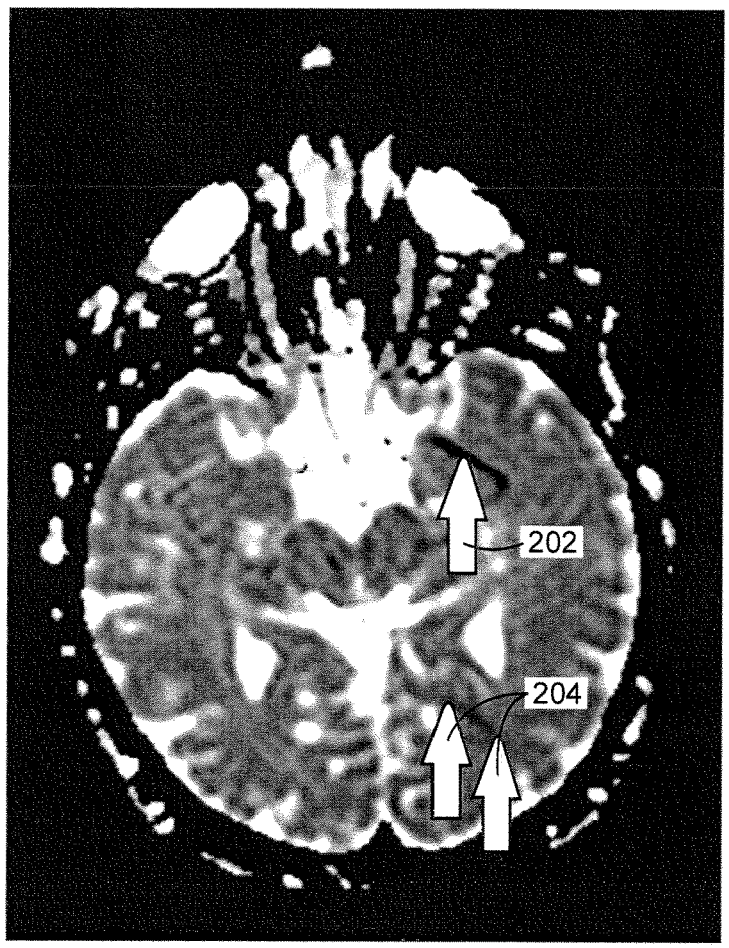
FIG. 2B illustrates an example of unfolding artifacts seen when a distorted EPI image is resolved in a conventional parallel imaging MRI system.

FIG. 2B illustrates an EPI image of a head, as in FIG. 2A, but acquired using parallel imaging. The distortions in EPI are such that masking from sensitivity maps, as conventionally done, may not agree with the location of the EPI signal in many instances. For example, when there is an area with significant signal (such as the signal of the right eye in FIG. 2A) that in the distorted EPI image extends outside a conventional mask, then the parallel imaging matrix inversion may place that signal in the wrong location. Artifacts 202 and 204 shown in FIG. 2B are examples of the misplacements of distorted significant signals. Artifact 202, for example, belongs at the top of the eye, roughly at the same location as the extreme distortion in FIG. 2A. But, as shown here, parallel imaging may reduce the gross distortion greatly, roughly by the same factor as the acceleration factor (about a factor of 3 in these images) of the image acquisition. It should also be noted that the wrongly unfolded signal may appear positive or negative, due to background phase differences. From a diagnostic point of view, artifact 202 in particular, which appears to be a relatively strong signal relative to other signals in the image may present significant challenges to correct interpretation of the image.

There are two aspects of the parallel imaging techniques which cause this erroneous reconstruction and aliasing. In the first aspect, the distortion in the main scan lies outside a mask which is conventionally formed from the coil sensitivity maps. Because it lies outside the mask, in the reconstructed image the distorted signal is forced elsewhere, such as, into another aliased pixel location.

The second aspect that causes erroneous reconstruction is that the sensitivity values (determined from the corresponding coil sensitivity maps) used for the distorted signal are wrong. Wrong values in the corresponding coil sensitivity maps can cause incorrect encoding values to be used in the unfolding. The errors in the coil sensitivity maps may be caused by extrapolating the measured coil sensitivities. These errors can also occur if the main scan distortion is far from the main signal and, in the presence of rapidly varying coil sensitivity maps, a local coil sensitivity value which has significant error is selected. When the presumed encoding is erroneous, then the subsequent unfolding step will also be erroneous, and correspondingly the final unfolded image will contain error and artifact.

The techniques disclosed herein provide for significantly reducing, or even eliminating, unfolding artifacts caused by spatially misregistered signals acquired in parallel MRI. The technique for reducing unfolding artifacts disclosed herein includes a technique for processing coil sensitivity maps and a technique for processing the mask used in unfolding. Although when used in combination the improved technique for processing coil sensitivity maps and the improved technique for processing masks yield superior results, in some embodiments only one of these techniques may be used for generating an improved diagnostic image.

The technique disclosed here for processing prescan coil sensitivity maps provides enhanced sensitivity maps by finding a perimeter of the object being scanned, and then extending the sensitivity maps by replicating sensitivity data outwardly—especially in the direction of most likely misregistration. The extension by replication in the direction of the most likely misregistration yields sensitivity maps that more accurately reflect actual coil sensitivities at aliased points in k-space when compared to conventional coil sensitivity map generation (which were typically based upon extrapolation of measured sensitivity data using a fitted polynomial corresponding to each RF coil in an array of RF coils).

The technique disclosed here for processing one or more masks, includes generating the one or more masks from a preliminary unfolding of the main scan (e.g., an intermediate diagnostic image). The mask thus created from a preliminary unfolding of a main scan image, when compared to the conventional masks created based upon coil sensitivity maps, better represents areas of significant signal (e.g., with substantially improved accuracy). Since the mask from the preliminary unfolding has geometric distortions identical to those of the main scan, its use will not incorrectly mask away areas where signal in the main scan is significant, and it will not force signal to be wrongly placed into other aliased pixels.

Thus, when either one or both of the above techniques are used in combination with, e.g., some conventional aspects from Pruessmann or SPEEDER™ (discussed above) to generate diagnostic images, improved images with reduced unfolding artifacts can be obtained.

Use of the herein disclosed new techniques enable reduction or substantial elimination of unfolding artifacts without substantial increases (e.g., times 2) in acquisition times required by conventional distortion correction techniques such as PLACE (a phase-based correction technique) and so-called blip-up-blip-down techniques. Moreover, artifacts are corrected without introducing fluctuations in a new series of images, such as would possibly confound FMRI, DSC or ASL processing. Further, disclosed embodiments can still use conventional prescan techniques, including those used for non-EPI parallel imaging scans. Additionally, the herein disclosed techniques should not require conditionals associated with building matrices of different sizes or selecting different subsets of pixels for inclusion/exclusion, thereby providing a model highly suited for parallel programming and computation speedup.

Figure 3:
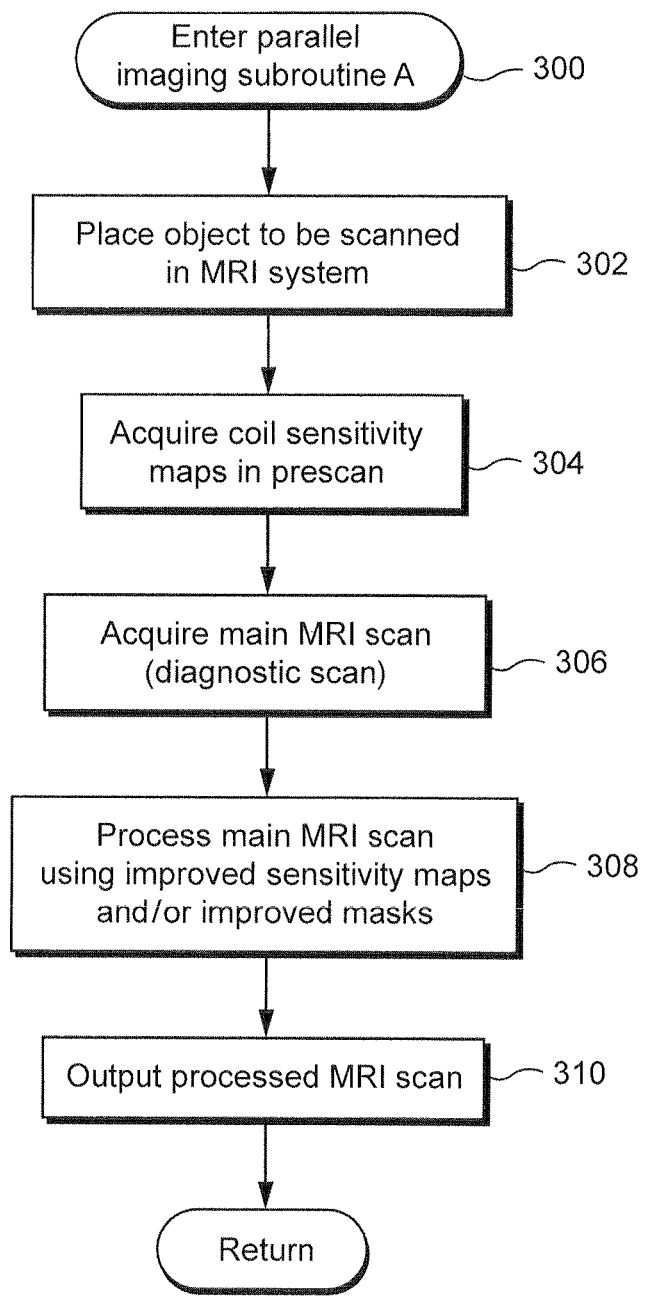
FIG. 3 illustrates a flow chart of a method for generating images with reduced unfolding artifacts from spatially misregistered signals, in accordance with one or more embodiments.

FIG. 3 illustrates a flow chart of a method for generating images with reduced unfolding artifacts from spatially misregistered signals, in accordance with one or more embodiments. In the illustrated embodiment, method 300 includes operations 302-310. In some embodiments, however, one or more of the operations 302-310 may not be performed, or may be performed in an order other than that shown.

At operation 302, the object to be scanned is placed in the MRI system. This operation includes, in addition to placing the object in the MRI gantry in a manner suitable for scanning, configuring the MRI system for executing the scanning sequences appropriate for acquiring the desired type of diagnostic images. Configurations may include selection of prescan and main scan sequences, reduction factor associated with parallel imaging, gradient configurations, and the like.

At operation 304, coil sensitivity maps are generated for the plurality of RF coils by performing a prescan of the object in the MRI gantry. The prescan can be executed in a configurable time period, typically on the order of a few seconds and substantially shorter in duration than a main scan. The prescan yields low resolution images for the entire imaging volume (in this case, with the object placed inside) in the scanner. U.S. Pat. No. 6,559,642 ("642 patent"), which is hereby incorporated by reference in its entirety, describes one or more prescan techniques. Any one of several prescan techniques, including the fast, 2D gradient-recalled echo pulse sequence described in the '642 patent may be used in an embodiment. In some embodiments, a 2D or 3D Fourier Transform field echo scan may be performed (e.g., possibly taking about 20 seconds).

The prescan can also include generation of coil sensitivity maps (these are also referred to as "spatial sensitivity maps") from data acquired in the prescan. In an embodiment, a technique selected from those described in Pruessmann or the '642 patent may be used to determine the coil sensitivity map. The '642 patent, for example, describes one or more techniques for determining coil sensitivities of each coil that may be used to create the sensitivity map for the coil array. For each coil, on a pixel-by-pixel basis, the '642 patent calculates the ratio of the prescan image intensity of a coil and the sum of all the coils' prescan image intensities. The techniques described in the '642 patent do not require calibration images of the WBC. However, other techniques may divide each prescan image with a body coil image to determine the spatial sensitivities of respective coils. These techniques remove noise (e.g., patient contribution to the measured signal) from the prescan images yielding the coil sensitivity maps, to define the spatial sensitivity map for each RF coil in the phased array coil. In one or more embodiments, the coil sensitivity maps may be stored for use in connection with one or more subsequent main scans.

At operation 306, a main scan of the object that is located in the MRI gantry is performed. The type of main scan and the sequence of images to be acquired may be configurable. In an embodiment, for example, an EPI main scan is performed. In parallel imaging techniques, all the coils in the phased array coil receive signals in parallel, and the spatial sensitivity maps of the respective coils are needed in order to recover the unaliased images from aliased images of the respective coils. The data received from this main scan is referred to herein as one or more intermediate diagnostic images.

At operation 308, the main scan data (e.g., the intermediate diagnostic image) is processed in accordance with one or more of coil sensitivity maps extended in accordance with an embodiment and/or of a mask in accordance with an embodiment to generate a final diagnostic image. The processing includes unfolding the intermediate diagnostic image using the coil sensitivity maps and/or a mask improved in accordance with embodiments herein described. The final diagnostic image has substantially reduced unfolding artifacts, as compared to conventional parallel imaging scans. In some embodiments, more than one final diagnostic image may be generated.

At operation 310, the final diagnostic image is output. The output may include displaying on a display of the MRI system, or an external display. In some embodiments, the output may include transmitting the one or more diagnostic images over a network interface which may be part of the MRI system, or storing in a memory or other storage device that is either in or otherwise communicatively coupled to the MRI system.

Figure 4:
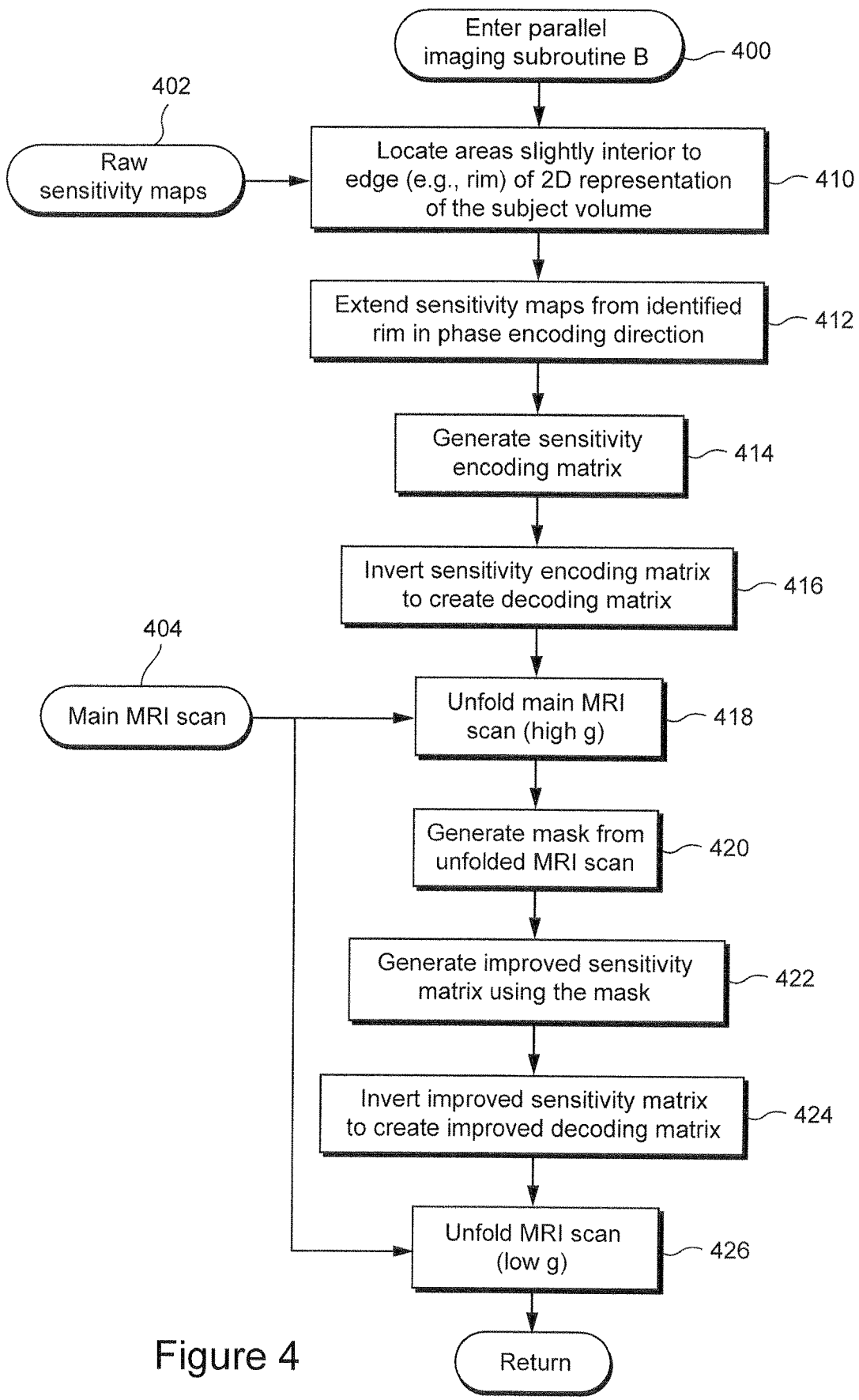
FIG. 4 illustrates a flow chart of a method to process main MRI scans using improved sensitivity maps and using improved masks, in accordance with one or more embodiments.

FIG. 4 illustrates a flow chart of a method 400 to process main MRI scans using a combination of improved sensitivity maps and improved masks, in accordance with one or more embodiments. In the illustrated embodiment, the method includes operations 410-426. In some embodiments, however, one or more of the operations 410-426 may not be performed, or may be performed in an order other than that shown. According to an embodiment, the operations 410-426 are performed in the processing of operation 308 discussed above.

Method 400 begins with operation 410. In operation 410, coil sensitivity maps, such as coil sensitivity maps generated in operation 304 discussed above, are processed to determine the edges (e.g., rim) of the object being scanned. The input coil sensitivity maps 402 are referred to herein as "raw coil sensitivity maps" to reflect that these maps have not yet been extended. However, some embodiments may use coil sensitivity maps upon which some further processing may have already been performed.

Operation 410 may include the use of a conventional edge finding technique to detect the edge of the object being scanned, using a 2D representation of the object (e.g., a cross-sectional slice image). Having identified the edge, a set of points slightly inside the edge is determined. The exact amount of distance to the edge from the set of selected points is configurable. For example, the selected points may be a configurable number of pixels inside of the edge, or a configurable distance measurement (e.g., millimeters, centimeters, etc.) inside from the edge, or within a configurable distance range (e.g., 0.5-1.5 cm). According to another embodiment, not all points in the set of selected points are at the same distance from the edge. Some points may be located at different distances from the edge, for example, because it is determined that an initially designated selected point may not have a value that represents that actual coil sensitivity with sufficient accuracy. For example, if the initially designated location for a point (according to the configured distance range) is very close to bone or an air pocket, then the initially designated location may be changed so that it is still within the configured distance range but further from the bone or air pocket that may have caused inaccurate sensitivity values in the immediately surrounding region.

At operation 412, the edge of the object in the coil sensitivity maps is extended. Specifically, respective points from the identified set of points (from operation 410) are replicated (as contrasted to a curve-fitted extrapolation) at least in the phase encoding direction of the main scan (e.g., where most error is expected) up to some configurable distance away from the edge. According to an embodiment, the points may be replicated up to the end of the field of view (FOV) in either direction along the phase encode axis (e.g., if phase encode is a left-right direction, then the selected points from slightly inside the edge are replicated so that the edge is extended to the left and to the right).

An example of an exemplary replication is illustrated in FIGS. 5A-C. Raw or uncorrected sensitivity maps 502 (e.g., sensitivity maps as acquired by the respective coils) are accessed in a memory or storage of the MRI system. Each raw sensitivity map 502 is analyzed to identify an exterior edge 504. FIG. 5A illustrates the raw sensitivity maps 502 with identified edges 504. Next, as described in relation to operation 410 above, a set of points 506 is identified (e.g., like a rim relatively near to the identified edge) slightly inside of the edge, as shown in FIG. 5B. According to an embodiment, in a head scan, points that are 1 cm inside of the edge can be selected. Next, as shown in FIG. 5C and discussed above in relation to operation 412, at least some points 508 and 510 from the selected set of points 506 are extended in the direction 512 and 514 of likely misregistration. As shown in this embodiment, the direction of likely misregistration is the direction of phase encoding associated with the main scan (which need not correspond to the phase encode direction of the sensitivity map prescan). The extensions 512 and 514 of the points are achieved by replicating points 508 and 510. As noted above, the extension of the points by replication in this embodiment is in contrast to conventional techniques which typically have extended sensitivity maps by extrapolating via curve-fitting to spatial polynomials for respective coils. Moreover, the preferred extension of points 508 and 510 in the phase encoding direction in this embodiment is, again, in contrast to conventional techniques which extend the edges in various (e.g., perhaps all) directions in accordance with curve-fitting to polynomials for the respective coils.

Figure 6A:
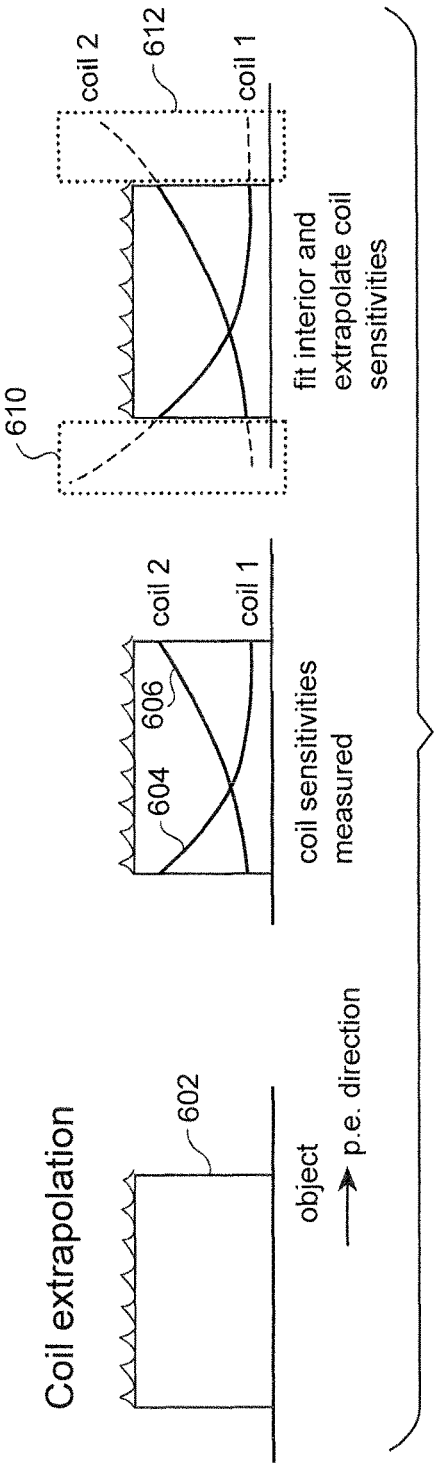
FIG. 6A illustrates example conventional techniques for extending sensitivity maps.
Figure 6B:
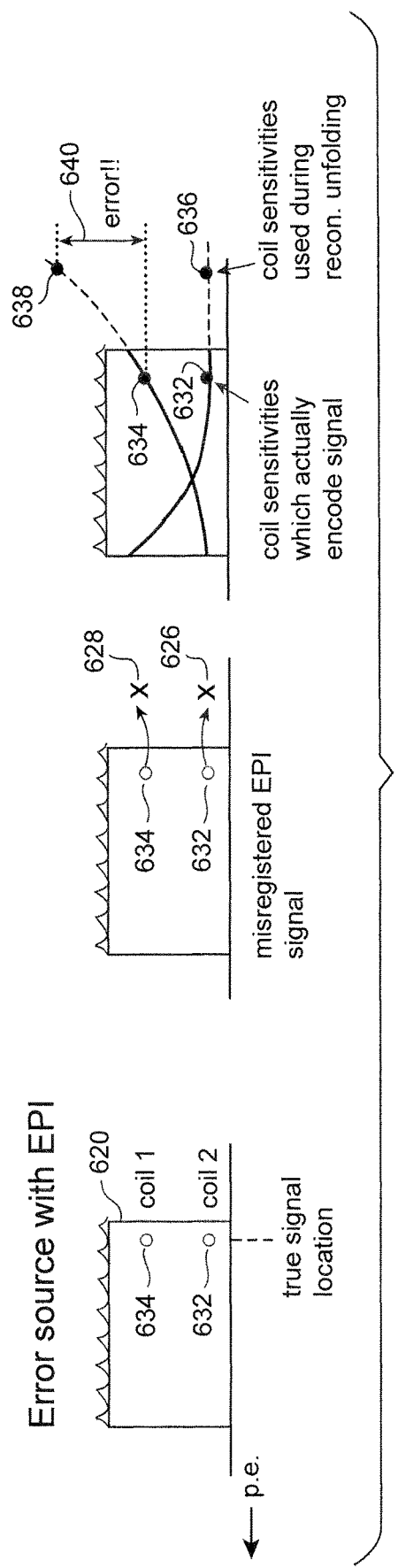
FIG. 6B illustrates example errors that can be caused by extending sensitivity maps according to conventional methods.
Figure 7:
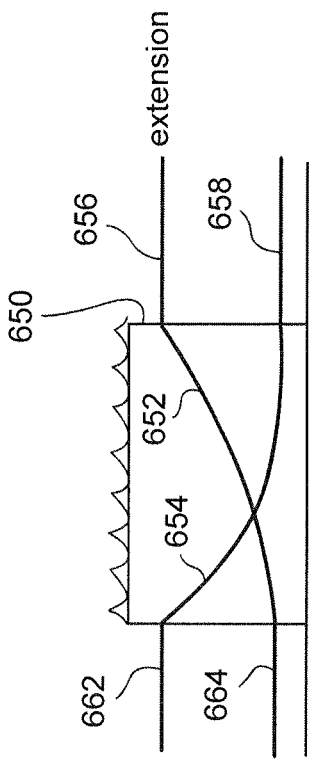
FIG. 7 illustrates a technique for extending sensitivity maps, in accordance with one or more embodiments.

A conventional technique of extending the edge of the scanned object by extrapolation is graphically illustrated in FIG. 6A. FIG. 6B illustrates an example of an error that can be caused by such conventional techniques for extending sensitivity maps. The extending of sensitivity maps by replication, according to exemplary embodiments, is illustrated in FIG. 7. In FIGS. 6A-B and 7, the physical phase encode direction is assumed to be along the horizontal (left-right) direction. The vertical direction in these small sketches can be thought of as a signal intensity axis.

FIG. 6A graphically illustrates the extension of coil sensitivity values in accordance with conventional techniques. An edge 602 of the scanned object is determined. Generally, areas within the detected edge are considered to have reliable measured coil sensitivity values. Thus, based upon the point values inside of the detected edge, curve-fitted polynomials are determined for respective coil sensitizes from the array. Considering an example array of 2 coils, polynomials 604 and 606 representing coil sensitivities respectively for coil 1 and coil 2 of the array are determined so as to fit corresponding point values within the area enclosed by the detected edge. The polynomials 604 and 606 may be determined, for example, by any one of several known polynomial fitting techniques. Having determined the polynomials for the respective coils for the interior of the object being scanned, conventional techniques then extrapolate each of the polynomials 604 and 606 into regions 610 and 612 outside of the detected edge. Some extrapolation techniques are described, for example, in King et al., U.S. Pat. No. 6,836,116 and Ballester et al., U.S. Pat. No. 6,949,928. Note that it is common that true coil sensitivity patterns without misregistration or distortion can rise very quickly outside of the object, because it is common for the coil array conductors to be located close to the object, and small distances between a signal location and a coil conductor element yield high sensitivities, according to the Biot-Savart law.

FIG. 6B graphically illustrates how, when conventional extension techniques are applied, a spatially misregistered signal such as that generated in EPI can lead to significant errors. Coil sensitivity values 632 and 634, (and EPI signal levels associated with images weighted by those same sensitivities) which are within the detected edge 620 of an object, may be referred to as being defined at a true or correct signal location. Values 626 and 628 representing the coil sensitivities (or the sensitivity-weighted main image (EPI) pixel signal values) but at a misregistered signal location, may appear nearby to the respective correct values 632 and 634. When the actual coil sensitivities are then extended based upon extrapolating corresponding polynomials, relatively large errors may occur. For example, the magnitude of misregistration-induced error between misregistered signal 628 and corresponding true signal 634 inside the edge 620 of the scanned object, as shown by 640 which indicates the difference between unfolded position 638 and corresponding misregistration position 634, gets substantially larger when reconstructing images.

With further reference to FIG. 6B, coil sensitivity values 634 and 632 are used to encode the corresponding signal. However, the corresponding coil sensitivities used during reconstruction unfolding are coil sensitivity values 638 and 636, respectively. These coil sensitivity values outside the detected edge 620 of the object are determined based upon the polynomials that fit the coil sensitivity values for respective coils. As graphically shown, the error 640 between 638, which is the coil sensitivity used during reconstruction, and coil sensitivity 634 which actually encodes the signal, appears to be substantially larger than the corresponding actual error caused by the particular misregistration of the signal. One of the reasons for the relatively large error between 634 and 638 is the extrapolation of data from inside the detected edge to outside in accordance with curve-fitted polynomials specific to the coil sensitivities of each coil.

FIG. 7 graphically illustrates extending points (e.g., coil sensitivity values) from inside the detected edge 650 to the outside, by replicating to the extended areas corresponding values from inside the detected edge, in accordance with an embodiment. Accordingly, the sensitivity map for coil 1 would include sensitivities 654 in the area inside the detected edge and sensitivities 658 and 662 in the extended areas. Likewise, the sensitivity map for coil 2 would include sensitivities 652 in the area inside the detected edge and sensitivities 656 and 664 in the extended areas.

Returning now to FIG. 4, at operation 414 a sensitivity encoding matrix is formed using the replication extended sensitivity maps. A technique such as that disclosed in Pruessmann or the '116 patent can be used to determine the sensitivity encoding matrix. The sensitivity encoding matrix can be, for example, an N×C matrix, wherein each row i, i=1 ... N represents a coil i of the phased array coil, and each column j, j=1 ... C represents an aliased pixel location. Thus, the value in the matrix at location (i, j) would represent the sensitivity for the $j^{th}$ pixel as received at coil i. The values for the respective elements in the sensitivity matrix can be determined from the sensitivity maps obtained during the prescan. Thus, before the sensitivity maps are extended (as in operation 412 above) the sensitivity matrix includes measured sensitivity values. After extension by replication, the sensitivity matrix may include some values based upon the extension.

At operation 416, the sensitivity encoding matrix is inverted to generate a decoding matrix. The decoding matrix enables converting the data from multiple coils (specified in the sensitivity matrix) back to multiple unaliased pixels. The inversion may be in accordance with known matrix inversion techniques, such as, for example, the Moore-Penrose pseudoinverse (which happens to be a closed form solution for the least-squares solution, with minimum noise, assuming simple forms of uniform uncorrelated noise). Optionally, receiver noise levels and correlation of noise in the receiver channels can be used when determining the inverse of the sensitivity matrix, as described in Pruessmann. In exemplary embodiments herein, the inversion may or may not consider receiver noise levels and correlation. However, when the decoding matrix is determined without considering receiver noise levels, some penalty in terms of reduced SNR (signal to noise ratio) can be expected.

At operation 418, the main scan 404 is unfolded. The unfolding of the main scan is performed using the decoding matrix generated at operation 416. In some embodiments, the unfolding at operation 418 is performed without using a mask. A mask indicates which ones of the data points in the images can be ignored due to being outside of a region of interest (ROI). According to another embodiment, the unfolding at operation 418 includes the use of a mask formed based upon the coil sensitivity maps or coil sensitivity matrix. For example, a mask formed based upon coil sensitivity maps or coil sensitivity matrix would indicate which of the pixel locations are inside a region of interest, and which pixel locations are outside, and such information can be used to improve the quality of the unfolding process by only considering pixel locations that are inside and/or close to, the ROI. It is noted that, because the sensitivity matrix and its pseudoinverse—the decoding matrix—are not unitary, the inversion would usually amplify any noise (as quantified by the "g-value") already present in the main image. A conventional technique to lower the g-value (e.g., reduce noise) is to exclude aliased points from encoding and inversion, if it is known from the sensitivity maps that there should be no signal at a particular location. Pruessmann describes reducing the size of the sensitivity matrix based upon removing aliased points that have no signal, and that solving a smaller system of constraints allows more freedom to minimize noise. Besides totally eliminating entire lines of the encoding matrix, it is also plausible to de-weight lines corresponding to pixels that should have little or not signal. U.S. Pat. No. 6,486,671 to King et al., which is hereby incorporated by reference in its entirety, describes a technique to modify the sensitivity matrix and add a regularizing term to the matrix inversion process, thereby reducing noise at the expense of some loss of signal fidelity. Conventionally, the points to exclude or de-weight are identified using the prescan sensitivity maps because they are intrinsically free of aliasing.

Techniques for unfolding a main scan image using a decoding matrix are known, and a technique such as that described in Pruessmann can be used to obtain an unfolded diagnostic image from the main scan using a decoding matrix as discussed above. The unfolded diagnostic image at this stage, is referred to as an intermediate diagnostic image.

At operation 420, a mask is generated from the main scan unfolded at operation 418 (the intermediate diagnostic image). The mask can be determined based upon a thresholding function by which certain pixels or areas are identified as having less than a required pixel intensity. The required pixel intensity may be configurable. The mask is intended to indicate which ones of the data points in the images can be ignored due to being outside of a ROI. The mask enables the exclusion of a pixel from consideration in the reconstruction, when the corresponding location in the scanned object contributes no signal, e.g., because it lies outside of the object or ROI. In general, by removing pixels that are not likely to contribute to the reconstruction, the degree of aliasing is reduced, which in turn may improve the SNR. Removing pixels from the encoding matrix can be done in totality, with matrices that have lines deleted, or the removal can be done in part and without changing the size of the matrices, by deweighting lines with multiplication by a small value. If lines are deweighted and not explicitly removed, the same size matrix inversion can be done for every set of aliased pixels, and the algorithm may be more amenable to computational parallel processing.

At operation 422, the mask generated at operation 420 is used to generate an improved sensitivity matrix. According to an embodiment, as described above, columns in the sensitivity matrix represent aliased pixel locations. According to an embodiment, based upon the mask, one or more columns in the sensitivity matrix which correspond to pixel locations that do not contribute a signal, or are outside of the ROI can be removed.

At operation 424, the improved sensitivity matrix is processed to generate an improved decoding matrix. Operation 424 may be performed in the same manner as operation 416, but based upon the improved sensitivity matrix. The improved sensitivity matrix can be inverted, with or without considering receiver noise, in order to generate the decoding matrix.

At operation 426, the improved decoding matrix is used to unfold the main scan image 404. Operation 426 may be performed in the same manner as operation 418 was performed, based upon the improved decoding matrix. By the end of operation 426, the main scan diagnostic image has been reconstructed.

Figure 8:
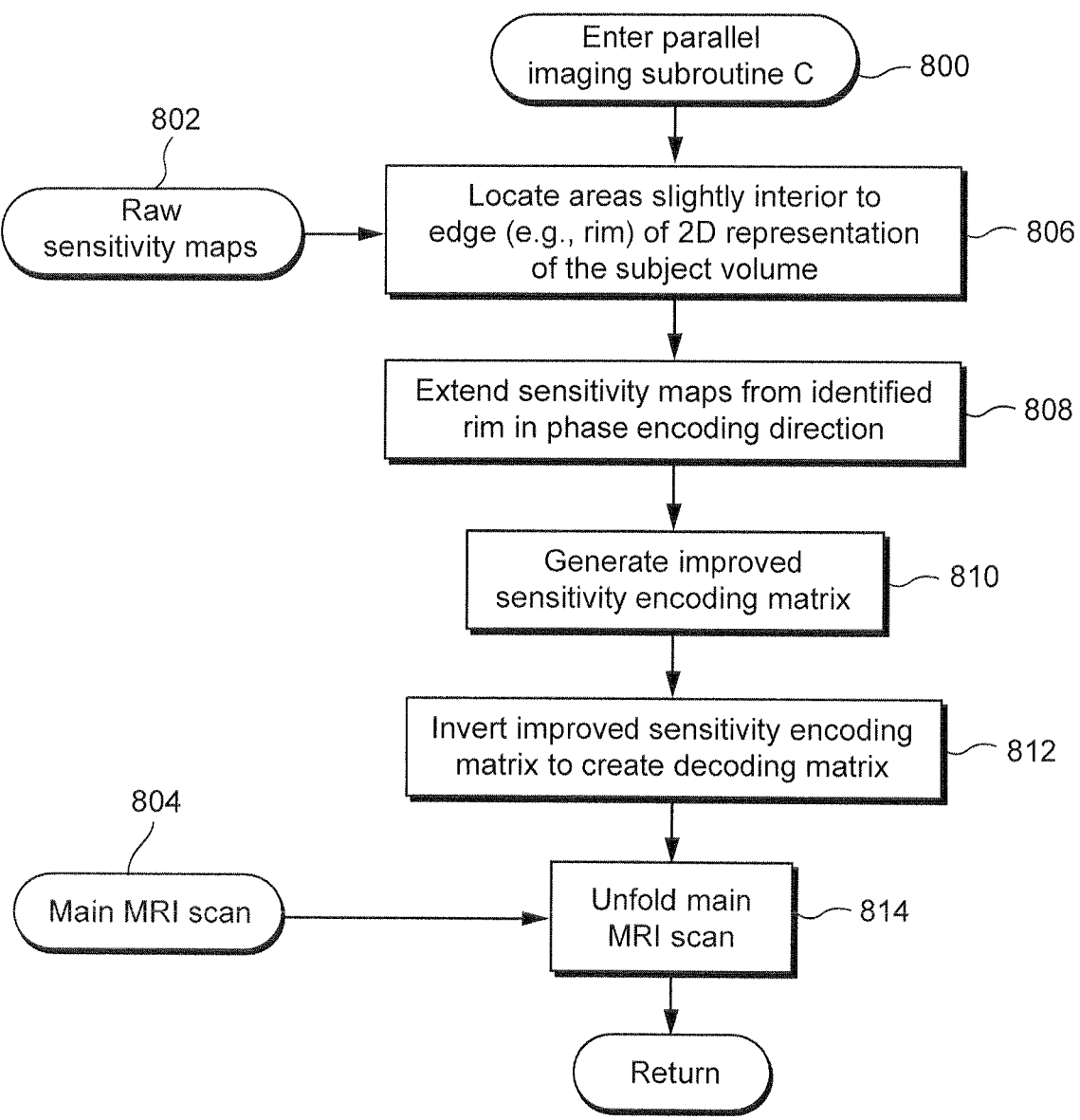
FIG. 8 illustrates a flow chart of a method to process main MRI scans using improved sensitivity maps, in accordance with one or more embodiments.

FIG. 8 illustrates a flow chart of a method 800 to process main MRI scans using improved sensitivity maps, in accordance with one or more embodiments. In the illustrated embodiment, the method includes operations 806-814. In some embodiments, however, one or more of the operations 806-814 may not be performed, or may be performed in an order other than that shown. According to an embodiment, the operations 806-814 are performed in the processing of operation 308 discussed above.

Method 800 may be used to generate diagnostic images using the improved sensitivity maps disclosed herein, but without requiring that the improved mask disclosed herein be used.

Method 800 begins at operation 806. Raw sensitivity maps 802, which may be sensitivity maps obtained from the receiver coils and which are not aliased, are provided as input to operation 806. Operations 806-812 may be performed in a manner similar to corresponding operations 410-416 as discussed above. Optionally, at operation 810, in addition to the processing discussed in relation to operation 414, a mask generated based upon the sensitivity maps or sensitivity matrix may be considered when the sensitivity encoding matrix is generated. The use of a mask in creating the decoding matrix is discussed above in relation to other operations.

At operation 814, the decoding matrix generated at operation 812 is used to unfold the main MRI scan 804. As discussed above in relation to method 400 and main MRI scan 404, main MRI scan 404 may be an aliased image.

Figure 9:
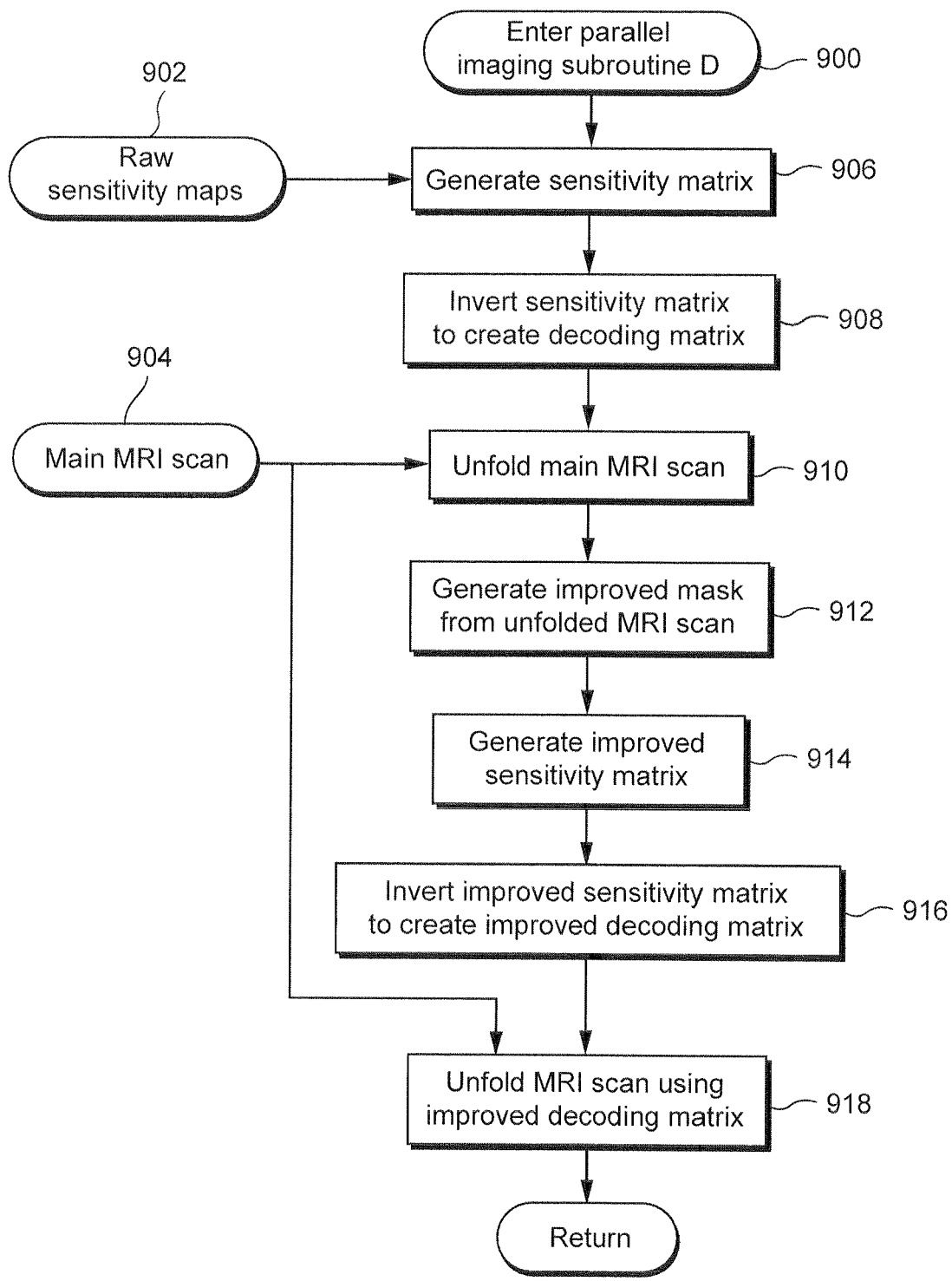
FIG. 9 illustrates a flow chart of a method to process main MRI scans using improved masks, in accordance with one or more embodiments.

FIG. 9 illustrates a flow chart of a method 900 to process main MRI scans using an improved mask, in accordance with one or more embodiments. In the illustrated embodiment, the method includes operations 906-918. In some embodiments, however, one or more of the operations 906-918 may not be performed, or may be performed in an order other than that shown. According to an embodiment, the operations 906-918 are performed in the processing of operation 308 discussed above.

Method 900 may be used to generate diagnostic images using the improved mask disclosed herein, but without requiring that the improved sensitivity maps disclosed herein be used.

Method 900 begins at operation 906. Raw sensitivity maps 902, which may be sensitivity maps obtained from the receiver coils and which are not aliased, are provided as input to operation 906. At operation 906, a sensitivity matrix is generated based upon the sensitivity maps. According to some embodiments, the sensitivity maps are used without any further processing to extend the maps beyond the object boundary. In other embodiments, the maps may be extended at operation 906 to extend beyond the object edges. The extension may be based upon extrapolation of known (e.g., measured) sensitivity values. For example, the extrapolation may be in accordance with prior art techniques such as those described above in relation to FIG. 6A, but preferably using the replication extension techniques such as that described above in relation to FIG. 7.

At operation 908, the sensitivity maps, which may or may not have been extended, are used to generate a sensitivity matrix and then, to determine a decoding matrix in accordance with the sensitivity matrix. The generation of a sensitivity matrix and a decoding matrix are discussed above.

At operation 910, the main MRI scan 904 is unfolded using the decoding matrix. At operation 912, a mask is generated based upon the main scan unfolded at operation 910. Unfolding and mask generation were described above in relation to method 400.

At operation 914, the sensitivity matrix is processed using the mask generated at operation 912 in order to generate an improved sensitivity matrix. In a manner similar to that discussed above in relation to operation 422, the improved sensitivity matrix may be generated by removing or otherwise de-weighting pixel locations that either do not provide a signal or lie outside the region of interest.

At operation 916, the improved sensitivity matrix from operation 914 is inverted to generate an improved decoding matrix. At operation 918, the main MRI scan 904 is unfolded, using the improved decoding matrix from operation 916.

Figure 10:
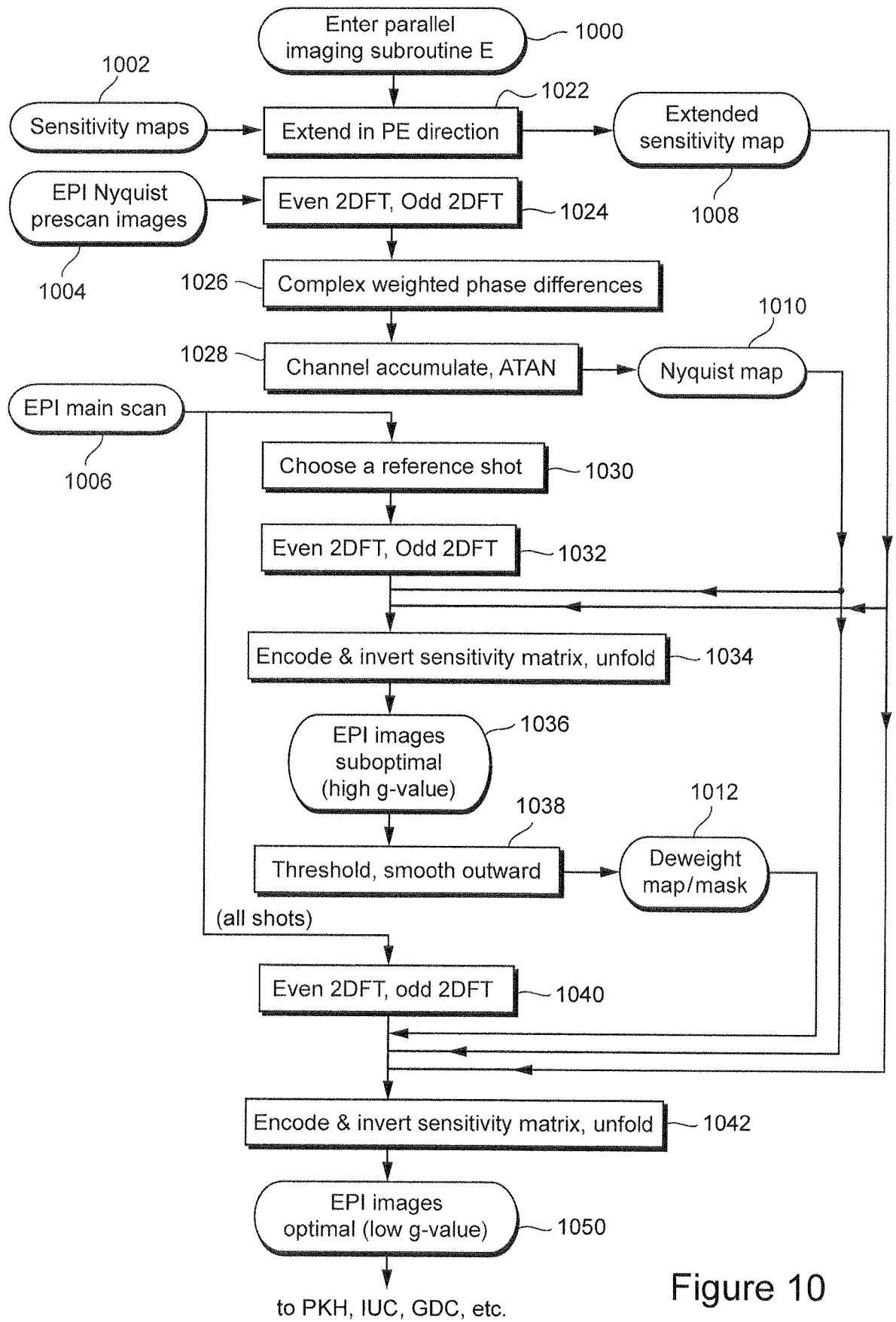
FIG. 10 illustrates a flow chart of a method to use improved sensitivity maps and improved masks, in accordance with one or more embodiments, in combination with 2D phase correction in EPI.

FIG. 10 illustrates a flow chart of a method 1000 to use improved sensitivity maps in combination with improved masks, in accordance with one or more embodiments, in combination with 2D phase correction in EPI. In the illustrated embodiment, the method includes operations 1022-1050. In some embodiments, however, one or more of the operations 1022-1050 may not be performed, or may be performed in an order other than that shown. According to an embodiment, the operations 1022-1050 are performed in the processing of operation 308 discussed above.

Method 1000 combines the improved sensitivity maps and improved mask, as disclosed herein, with the use of 2D phase correction in EPI. 2D phase correction is used frequently to remove Nyquist ghosts in EPI images. Xu, D. et al., "Robust 2D Phase Correction for Echo-Planar Imaging Under a Tight Field of View" Magn. Reson. Med., 2010 December; 64(6):1800-13 ("Xu") includes a description of 2D phase correction in EPI. In general, method 1000 illustrates the use of improved sensitivity maps and improved masks as disclosed herein with 2D Nyquist low spatial frequency ghost correction.

At operation 1022, coil sensitivity maps 1002 are extended in the phase encoding direction. As discussed above in relation to operations 410-412, extending coil sensitivity maps 1002 may include locating an area on the sensitivity maps or prescan images which are slightly inside of the edge of the object, and extending identified pixels by replication in the phase encode direction. The extended sensitivity maps 1008 may be held in a memory.

At operation 1024, EPI Nyquist prescan data (also known as "EPI templates") 1004 is taken as input to generate separate even and odd reference images using 2DFT (2D Fourier transform). The EPI templates may have been acquired in a prescan (separate from the prescan that obtains sensitivity maps). At operation 1026, the even and odd reference images are used to determine phase differences of the even-line images and the odd-line images. At operation 1028, phase differences over the multiple channels are accumulated with or without additional processing to generate Nyquist correction map 1010. Nyquist correction map 1010, in some embodiments, identifies the multiplicative complex phase map needed to remove Nyquist ghosts.

At operation 1030, a reference MRI data acquisition shot from among images of an EPI main scan 1006 is selected. At operation 1032, based upon the selected reference image, the even and odd 2DFT image data for mask generation are determined.

At operation 1034, the even and odd 2DFT image data determined at operation 1032, Nyquist map 1010, and extended sensitivity maps 1008 are taken as input to generate intermediate EPI images 1036. Operation 1034 may include encoding of a sensitivity matrix, inverting the sensitivity matrix to generate the decoding matrix, and then using the decoding matrix to unfold the EPI images. The EPI images 1036 are, however, suboptimal in the sense that they may have high g-values.

At operation 1038, based upon the suboptimal EPI images 1036, pixel locations whose intensity values are less than a threshold are identified. The threshold may be configured or dynamically determined. These locations may be weighted in a manner that the respective locations have decreasing weight as they spread out from the scanned object. The pixels locations identified as below a threshold are then used to determine a mask or deweight map 1012.

At operation 1040, even and odd 2DFT are determined for all EPI main scan images 1006. Then, at operation 1042, the even and odd 2DFT image data from each of the EPI main scan images 1006 is considered together with the mask 1012, Nyquist map 1010, and extended sensitivity maps 1008, to generate final EPI images 1050 which have lowered g-values as desired. Similar to operation 1034, operation 1042 includes encoding a sensitivity matrix, generating a decoding matrix, and unfolding the EPI images using the decoding matrix.

Subsequently, the final EPI images can be subjected to various post processing functions, such as, for example, PKH (Partial k-space homodyne filtering correction), IUC (radio frequency Image Uniformity Correction), GDC (Gradient distortion correction), and the like. The final diagnostic images are obtained from the final EPI images or post processed final EPI images.

As will be appreciated, the above embodiments provide improved parallel MR imaging by using either or both of:

(a) an unfolded "intermediate" diagnostic image to create a more accurate mask for use in further processing raw image data for final unfolded diagnostic images; and/or (b) an extension of coil sensitivity maps by replication (rather than curve-fitted extrapolation) for use in final unfolding of diagnostic images.

Also, as those in the art will appreciate, it is possible to not generate or use a mask if instead a "regularization" process is used.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) system configured for effecting parallel MR imaging with reduced unfolding artifacts of spatially misregistered signals, said MRI system comprising:

an MRI gantry including a static magnetic field coil, gradient magnetic field coils, at least one radio frequency (RF) coil configured to transmit RF signals into an imaging volume, and a plurality of RF receiver coils configured to receive nuclear magnetic resonance (NMR) RF signals from an object located in the imaging volume;

at least one digital data processing unit coupled to receive digital data from said plurality of RF receiver coils, said at least one digital data processing unit also being configured to:

generate a coil sensitivity map corresponding to each of the plurality of receiving RF coils based upon a prescan of local sensitivity data provided from a preparation MRI scan (prescan) of the object;

unfold diagnostic MRI scan data provided from a diagnostic MRI scan of the object in order to generate a diagnostic MRI image, the unfolding using a parallel imaging matrix inversion of a sensitivity matrix based on said generated coil sensitivity maps; and output the diagnostic MRI image onto a display or into storage within a nontransient digital data storage medium or onto an outbound data transmission,
wherein, said at least one digital data processing unit has been further configured to effect either or both of:
(a) extending said coil sensitivity maps by identifying a boundary of the object in the generated coil sensitivity maps or the preparation MRI prescan of local sensitivity data, and replicating the preparation MRI prescan of local sensitivity map data beyond said identified boundary; and/or
(b) unfolding the diagnostic MRI scan data in order to generate the diagnostic MRI image by preliminarily unfolding the diagnostic MRI scan data in order to define a boundary of a mask image based on measured MRI signal intensities, and using the defined boundary of the mask image in order to mask the diagnostic MRI scan data prior to unfolding the masked diagnostic MRI scan data into the diagnostic MRI image by using said parallel imaging matrix inversion.

2. The MRI system as in claim 1, wherein said at least one digital data processing unit is configured to effect at least said extending of the coil sensitivity maps by (a) replication, and wherein a direction of the coil sensitivity map extension by replication is in a direction of MRI phase encoding of said diagnostic MRI scan.

3. The MRI system as in claim 1, wherein said at least one digital data processing unit is configured to effect both limitation (a) extending of the generated coil sensitivity maps and limitation (b) unfolding, by said preliminarily unfolding, of the diagnostic MRI scan data, and to:
(c) extend the generated coil sensitivity maps by replication in at least one direction;
(d) generate the mask image for the object based upon an unfolded intermediate copy of the diagnostic MRI scan data; and
(e) thereafter unfold said diagnostic MRI scan data into the diagnostic MRI image based upon both the generated extended coil sensitivity maps of (c), and the generated mask image of (d).

4. The MRI system as in claim 1, wherein said at least one digital data processing unit is configured to effect at least said extending of the generated coil sensitivity maps, and to extend the generated coil sensitivity maps by replicating points selected from within an area defined by a detected edge corresponding to the object.

5. The MRI system as in claim 4, wherein the at least one digital data processing unit is further configured to extend the generated coil sensitivity maps into a desired field of view (FOV).

6. The MRI system as in claim 1, wherein the at least one digital data processing unit is configured to effect at least said unfolding of the diagnostic MRI scan data by said preliminarily unfolding, and configured to unfold at least one unmasked intermediate diagnostic data image from said diagnostic MRI scan in order to generate the mask image which is thereafter used in order to unfold a masked copy of diagnostic image data from said diagnostic MRI scan.

7. The MRI system as in claim 1, wherein the diagnostic MRI scan is an echo planar imaging (EPI) scan.

8. The MRI system as in claim 1, wherein the at least one digital data processing unit is configured to effect at least said extending of the generated coil sensitivity maps, and configured to use the generated coil sensitivity maps based upon the preparation MRI prescan data provided from one prescan of the object in order to unfold diagnostic magnetic resonance image scan data generated based upon further MRI scan data obtained from a plurality of further MRI scans.

9. The MRI system as in claim 1, wherein the at least one digital data processing unit is configured to effect at least said unfolding of the diagnostic MRI scan data by said preliminarily unfolding, and configured to, when a plurality of further diagnostic MRI scans of the object are performed, use the mask image generated in a selected one of the further diagnostic MRI scans in unfolding the respective diagnostic MRI scan data of the non-selected others of the further diagnostic MRI scans.

10. The MRI system as in claim 1, wherein the at least one digital data processing unit is configured to effect at least said unfolding of the diagnostic MRI scan data by said preliminarily unfolding, and configured to unfold the diagnostic MRI scan data based upon a Nyquist map generated from EPI Nyquist prescan images that have been obtained from a second MRI prescan of the object.

11. A magnetic resonance imaging (MRI) method configured for effecting parallel MR imaging with reduced unfolding artifacts of spatially misregistered signals, said MRI method comprising:
placing an object into an MRI gantry including a static magnetic field coil, gradient magnetic field coils, at least one radio frequency (RF) coil configured to transmit RF signals into an imaging volume, and a plurality of RF receiver coils configured to receive nuclear magnetic resonance (NMR) RF signals from said object when located in the imaging volume;
generating with at least one digital data processing unit, a coil sensitivity map corresponding to each of the plurality of receiving RF coils based upon a prescan of local sensitivity data provided from a preparation MRI scan (prescan) of the object;
unfolding diagnostic MRI scan data provided from a diagnostic MRI scan of the object in the at least one digital data processing unit order to generate a diagnostic MRI image, the unfolding using a parallel imaging matrix inversion of a sensitivity matrix based on said generated coil sensitivity maps; and
outputting the diagnostic MRI image onto a display or into storage within a non-transient digital data storage medium or onto an outbound data transmission,
wherein, said method effects either or both of:
(a) extending said generated coil sensitivity maps by identifying a boundary of the object in the generated coil sensitivity maps or the preparation MRI prescan of local sensitivity data, and replicating the preparation MRI prescan of local sensitivity map data beyond said identified boundary; and/or
(b) unfolding of the diagnostic MRI scan data in order to generate the diagnostic MRI image by a preliminarily unfolding of the diagnostic MRI scan data along with defining a boundary of a mask image based on measured MRI signal intensities, and using the defined boundary of the mask image in order to mask the diagnostic MRI scan data prior to unfolding the masked diagnostic MRI scan data into the diagnostic MRI image Fusing said parallel imaging matrix inversion.

12. The MRI method as in claim 11, comprising at least said extending of the generated coil sensitivity maps, wherein a direction of the generated coil sensitivity map extension occurs by replication in a direction of MRI phase encoding of said diagnostic MRI scan.

13. The MRI method as in claim 11 comprising both limitation (a) extending of the generated coil sensitivity maps and limitation (b) unfolding, by said preliminarily unfolding, of the diagnostic MRI scan data, wherein the method further comprises:
  (c) extending the generated coil sensitivity maps by replication in at least one direction;
  (d) generating the mask image for the object based upon an unfolded intermediate copy of the diagnostic MRI scan data; and
  (e) unfolding said diagnostic MRI scan data into the diagnostic MRI image based upon both the generated extended coil sensitivity maps of (c), and the generated mask image of (d).

14. The MRI method as in claim 11, comprising performing at least said extending of the generated coil sensitivity maps with the at least one digital data processing unit, wherein the generated coil sensitivity maps are extended by replicating points selected from within an area defined by a detected edge corresponding to the object.

15. The MRI method as in claim 11, comprising at least said unfolding of the diagnostic MRI scan data is performed by said preliminarily unfolding, wherein at least one unmasked intermediate diagnostic data image is unfolded to generate the mask which is thereafter used to unfold a masked copy of diagnostic image data.

16. The MRI method as in claim 11, wherein the diagnostic MRI scan is an echo planar imaging (EPI) scan.

17. The MRI method as in claim 11, comprising performing with the at least one digital data processing unit, at least said extending of the generated coil sensitivity maps, wherein the coil sensitivity maps are generated based upon the preparation MRI prescan data provided from one prescan of the object which are used to unfold diagnostic magnetic resonance image scan data generated based upon further MRI scan data obtained from a plurality of further MRI scans.

18. The MRI method as in claim 11, comprising with the at least one digital data processing unit, performing said unfolding of the diagnostic MRI scan data by said preliminarily unfolding, wherein, when a plurality of further diagnostic MRI scans of the object are performed with the at least one digital data processing unit, the mask image generated in a selected one of the further diagnostic MRI scans is used in unfolding the respective diagnostic MRI scan data of the non-selected others of the further diagnostic MRI scans.

19. The MRI method as in claim 11, comprising performing said unfolding of the diagnostic MRI scan data by said preliminarily unfolding with the at least one digital data processing unit, wherein the diagnostic MRI scan data is unfolded based upon a Nyquist map generated from EPI Nyquist prescan images that have been obtained from a second MRI prescan of the object.

20. A non-transitory computer readable storage medium, having executable computer program instructions recorded thereon, which when executed by at least one processor of a magnetic resonance imaging (MRI) system having an MRI gantry including a static magnetic field coil, gradient magnetic field coils, at least one radio frequency (RF) coil configured to transmit RF signals into an imaging volume and a plurality of RF receiver coils configured to receive nuclear magnetic resonance (NMR) RF signals from an object located in the imaging volume, causes the at least one processor to generate a diagnostic image having reduced unfolding artifacts of spatially misregistered signals, by performing operations comprising:
  generating a coil sensitivity map corresponding to each of the plurality of receiving RF coils based upon a prescan of local sensitivity data provided from a preparation MRI scan (prescan) of the object;
  unfolding diagnostic MRI scan data provided from a diagnostic MRI scan of the object in order to generate a diagnostic MRI image, the unfolding using a parallel imaging matrix inversion of a sensitivity matrix based on said generated coil sensitivity maps in order to generate a diagnostic MRI image; and
  outputting the diagnostic MRI image onto a display or into storage within a non-transient digital data storage medium or onto an outbound data transmission,
    wherein, said operations of the at least one processor of the magnetic resonance imaging (MRI) system effect either or both of:
    (a) extending said coil sensitivity maps by identifying a boundary of the object in the generated coil sensitivity maps or the preparation MRI prescan of local sensitivity data, and replicating the preparation MRI prescan of local sensitivity map data beyond said identified boundary; and/or
    (b) unfolding of the diagnostic MRI scan data in order to generate the diagnostic MRI image by preliminarily unfolding the diagnostic MRI scan data and in order to define a boundary of a mask image based on measured MRI signal intensities, and using the defined boundary of the mask image in order to mask diagnostic MRI scan data prior to unfolding the masked diagnostic MRI scan data into the diagnostic MRI image by using said parallel imaging matrix inversion.

* * * * *